US012745633B2

(12) United States Patent
Yamamoto et al.

(10) Patent No.: US 12,745,633 B2
(45) Date of Patent: Sep. 22, 2026

(54) SEMICONDUCTOR MODULE AND POWER CONVERTER

(71) Applicant: Mitsubishi Electric Corporation, Tokyo (JP)

(72) Inventors: Shotaro Yamamoto, Tokyo (JP); Yoshiko Tamada, Tokyo (JP); Kazuya Okada, Tokyo (JP); Seiji Oka, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 386 days.

(21) Appl. No.: 18/566,668

(22) PCT Filed: Jun. 9, 2021

(86) PCT No.: PCT/JP2021/021929
§ 371 (c)(1),
(2) Date: Dec. 4, 2023

(87) PCT Pub. No.: WO2022/259426
PCT Pub. Date: Dec. 15, 2022

(65) Prior Publication Data
US 2024/0274498 A1 Aug. 15, 2024

(51) Int. Cl.
*H10W 40/25* (2026.01)
*H10W 70/40* (2026.01)
*H10W 90/00* (2026.01)

(52) U.S. Cl.
CPC ....... *H10W 40/255* (2026.01); *H10W 70/415* (2026.01); *H10W 90/00* (2026.01);
(Continued)

(58) Field of Classification Search
CPC . H10W 40/255; H10W 90/811; H10W 90/00; H10W 90/753; H10W 90/794;
(Continued)

(56) References Cited

U.S. PATENT DOCUMENTS

2013/0277800 A1 10/2013 Hori et al.
2015/0028462 A1 1/2015 Hasegawa et al.
(Continued)

FOREIGN PATENT DOCUMENTS

JP 2013-222950 A 10/2013
JP 2018-022818 A 2/2018
(Continued)

OTHER PUBLICATIONS

International Search Report and Written Opinion mailed on Sep. 7, 2021, received for PCT Application PCT/JP2021/021929, filed on Jun. 9, 2021, 8 pages including English Translation.

*Primary Examiner* — Eric W Jones
(74) *Attorney, Agent, or Firm* — XSENSUS LLP

(57) ABSTRACT

A semiconductor module includes a semiconductor chip, an insulating substrate, a relay board, and a heat-dissipating component. The insulating substrate includes a main circuit pattern and an insulating layer. The main circuit pattern is electrically connected to the semiconductor chip. The relay board sandwiches the semiconductor chip together with the main circuit pattern in a direction in which the insulating layer and the semiconductor chip sandwich the main circuit pattern. The relay board is electrically connected to the main circuit pattern through the semiconductor chip. The heat-dissipating component is sandwiched between the insulating substrate and the relay board in the sandwiching direction. The main circuit pattern at least partially surrounds the heat-dissipating component on the insulating layer.

20 Claims, 20 Drawing Sheets

(52) U.S. Cl.
CPC ........ *H10W 90/811* (2026.01); *H10W 90/753* (2026.01); *H10W 90/755* (2026.01); *H10W 90/792* (2026.01); *H10W 90/794* (2026.01)

(58) Field of Classification Search
CPC ............. H10W 90/792; H10W 90/755; H10W 70/415
USPC .......................................................... 257/706
See application file for complete search history.

(56) References Cited

U.S. PATENT DOCUMENTS

| | | | | |
|---|---|---|---|---|
| 2016/0027711 | A1 | 1/2016 | Harada | |
| 2020/0020622 | A1* | 1/2020 | Kaji | H10W 40/255 |
| 2020/0266129 | A1* | 8/2020 | Higashi | H10W 70/411 |
| 2022/0328376 | A1* | 10/2022 | Kwon | H10W 40/22 |

FOREIGN PATENT DOCUMENTS

| | | | |
|---|---|---|---|
| WO | 2014/013705 | A1 | 1/2014 |
| WO | 2015/049944 | A1 | 4/2015 |

* cited by examiner 100
1
6a(6)
22
1a
1b
22
4a(4)
6b(6)
4b(4)
23
21a(21)
29a(29)
22
21b(21)
29b(29)
2
DR2
DR3
DR1

100
5
5a
5b
5c(5)
3
34a(34)
33
32
31a(31)
16
16a
16b
1
1a
1b
16
16b
16a
31b(31)
34b(34)
6a(6)
4a(4)
Ha
29a(29)
21a
21b
21
6b(6)
22
23
29b(29)
Hb
4b(4)
2
DR3
DR2
DR1

100

1

29a(29) 4a(4) 6a(6) 1a 1b 22 4b(4) 29b(29)

23 22 21a(21) 22 21b(21)

2

4
1a(1) 4a 4b 1b(1)
10 10 40 40 40 40 40 40 10 10
100

290 290 290 22 21a(21) 22 21b(21) 23 290 290 290
29a(29) 2 29b(29)

100
5
5a
5b
5c(5)
3
33
32
31a(31)
31b(31)
16
16a
16b
1
1a
1b
16
16b
16a
6a(6)
4(49)
29a(29)
21a
21b
21
6b(6)
22
23
29b(29)
4(49)
2
DR3
DR2
DR1

SEMICONDUCTOR MODULE AND POWER CONVERTER

CROSS-REFERENCE TO RELATED APPLICATION

This application is based on PCT filing PCT/JP2021/021929, filed Jun. 9, 2021, the entire contents of which are incorporated herein by reference.

TECHNICAL FIELD

The present disclosure relates to a semiconductor module and a power converter.

BACKGROUND ART

A semiconductor module for electric power is known which includes a semiconductor element made of silicon or silicon carbide. Such a semiconductor module for electric power is called a power module. Some power modules have a structure in which a semiconductor element is sandwiched between cooling members for heat dissipation to enhance dissipation of heat generated inside the power module. The cooling member may be an insulating substrate.

For example, WO 2015/049944 (PTL 1) discloses a semiconductor module comprising a printed circuit board (relay board), a first insulating substrate (insulating substrate), a second insulating substrate, a first semiconductor chip (semiconductor chip), a second semiconductor chip, and a first heat-dissipating component (heat-dissipating component), and a second heat-dissipating component. The first semiconductor chip and the first heat-dissipating component are sandwiched between the printed circuit board and the first insulating substrate. The first semiconductor chip is electrically connected to a first wiring layer (main circuit pattern) of the printed circuit board. The second semiconductor chip and the second heat-dissipating component are sandwiched between the printed circuit board and the second insulating substrate. Heat generated in the first semiconductor chip and the printed circuit board are dissipated from the first insulating substrate through the first heat-dissipating component.

CITATION LIST

Patent Literature

PTL 1: WO 2015/049944

SUMMARY OF INVENTION

Technical Problem

In the semiconductor module disclosed in the patent literature mentioned above, the main circuit pattern is disposed in such a manner that only one side surface of the main circuit pattern is opposed to the side surface of the heat-dissipating component. Therefore, the area of the main circuit pattern is small. This restricts the design layout of the insulating substrate. This leads to the restriction of the design layout of the semiconductor module.

In light of the above problem, it is an object of the present disclosure to provide a semiconductor module capable of reducing restrictions on the design layout thereof and a power converter.

Solution to Problem

The present disclosure is directed to a semiconductor module including a semiconductor chip, an insulating substrate, a relay board, and a heat-dissipating component. The insulating substrate includes a main circuit pattern and an insulating layer. The main circuit pattern is electrically connected to the semiconductor chip. The insulating layer sandwiches the main circuit pattern together with the semiconductor chip. The relay board sandwiches the semiconductor chip together with the main circuit pattern in a direction in which the insulating layer and the semiconductor chip sandwich the main circuit pattern. The relay board is electrically connected to the main circuit pattern through the semiconductor chip. The heat-dissipating component is sandwiched between the insulating substrate and the relay board in the sandwiching direction. The heat-dissipating component is electrically insulated from the semiconductor chip and the main circuit pattern. The main circuit pattern at least partially surrounds the heat-dissipating component on the insulating layer.

Advantageous Effects of Invention

In semiconductor module of the present disclosure, the main circuit pattern at least partially surrounds the heat-dissipating component on the insulating layer. This makes it possible to increase the area of the main circuit pattern. Therefore, it is possible to reduce restrictions on the design layout of the semiconductor module.

DESCRIPTION OF EMBODIMENTS

Hereinbelow, embodiments will be described on the basis of the drawings. It should be noted that the same reference signs in the following description denote the same or equivalent portions, and the description of such portions will not be repeated.

Embodiment 1

With reference to FIG. 1 to FIG. 7, the configuration of a semiconductor module 100 according to Embodiment 1 will be described.

Figure 1:
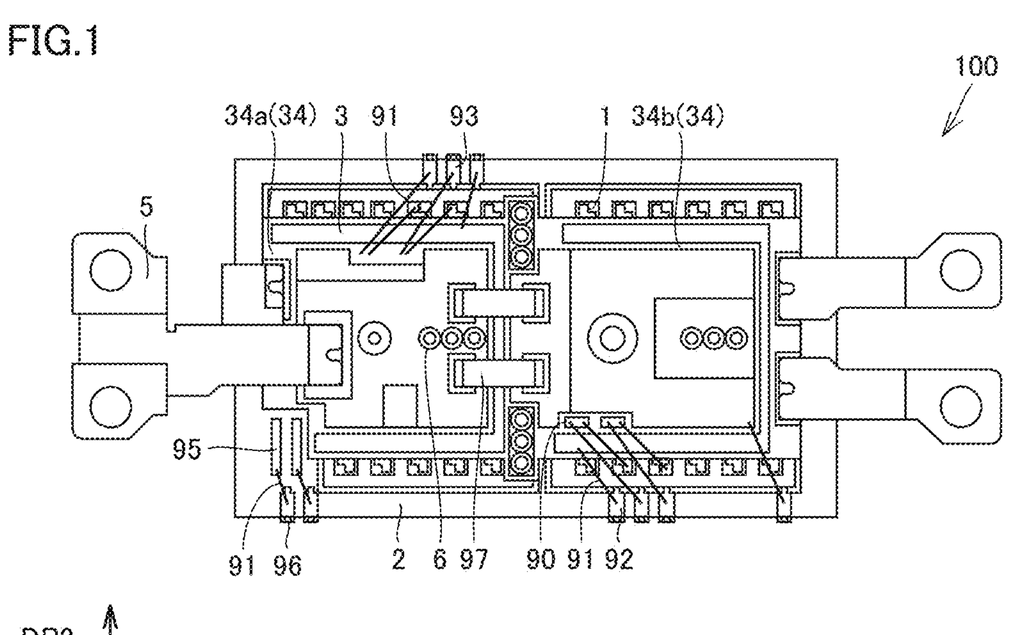
FIG. 1 is a top view schematically showing the configuration of a semiconductor module according to Embodiment 1.
Figure 2:
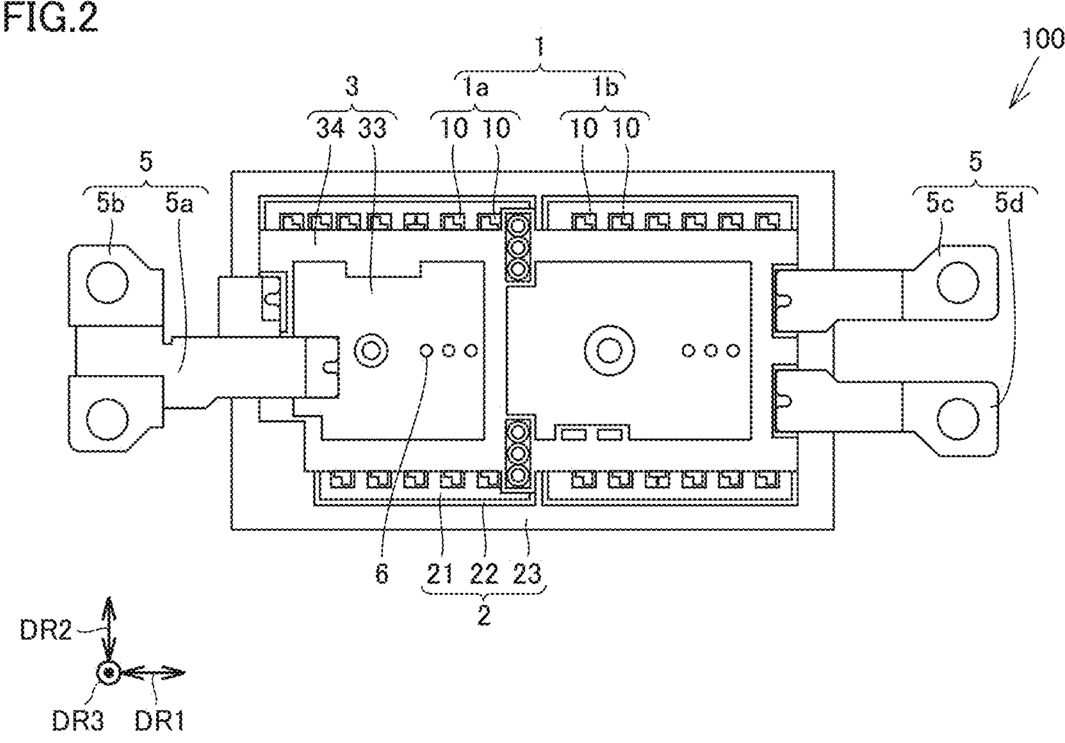
FIG. 2 is a top view schematically showing the configurations of a semiconductor chip, an insulating substrate, a relay board, an electrode terminal, and a conductive post of the semiconductor module according to Embodiment 1.
Figure 3:
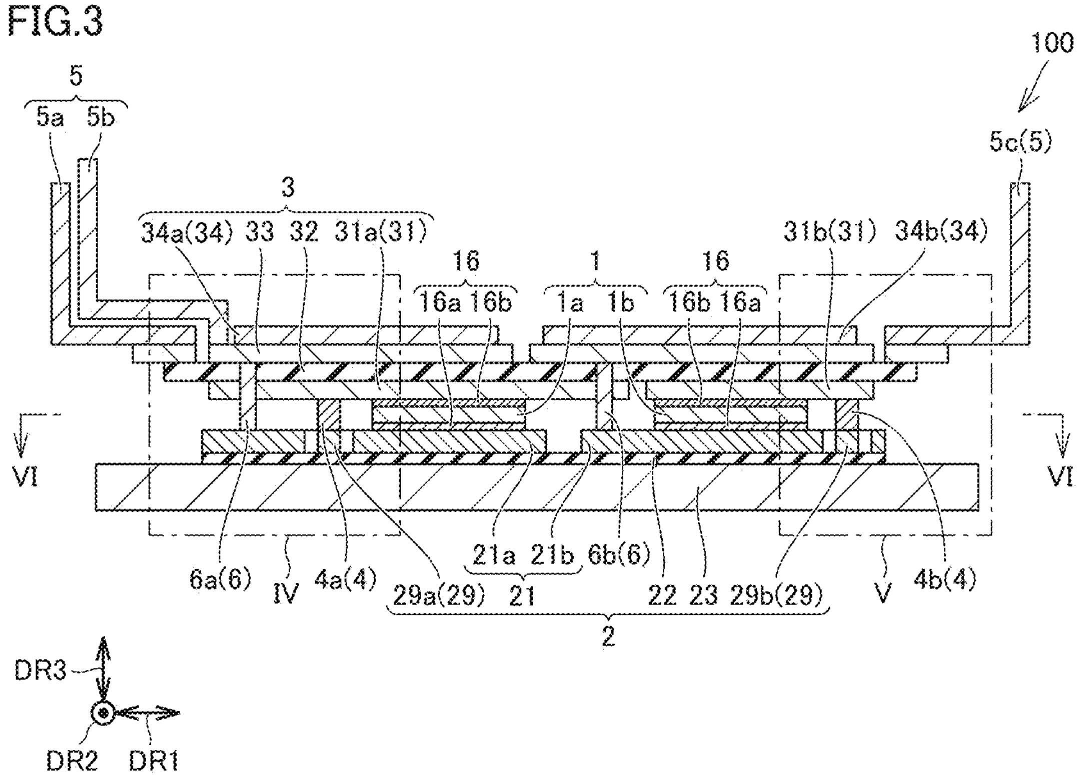
FIG. 3 is a sectional view schematically showing the configuration of a semiconductor module according to a first modification of Embodiment 1.

As shown in FIG. 1 and FIG. 2, semiconductor module 100 mainly includes a semiconductor chip 1, an insulating substrate 2, a relay board 3, and an electrode terminal 5. As shown in FIG. 3, semiconductor module 100 includes a heat-dissipating component 4 and a conductive post 6. It should be noted that for illustration purpose, the configurations of semiconductor chip 1 and conductive post 6 of semiconductor module 100 shown in FIG. 3 are more simplified than those shown in FIG. 2.

Semiconductor chip 1 is a semiconductor chip for electric power. Such a semiconductor chip for electric power is called a power semiconductor chip. Semiconductor chip 1 is, for example, a metal oxide semiconductor field effect transistor (MOSFET) made of silicon carbide (SiC). Semiconductor chip 1 includes a drain electrode, a source electrode, and a gate electrode which are not shown.

Semiconductor chip 1 includes a first chip 1*a* and a second chip 1*b*. First chip 1*a* is electrically connected in parallel to second chip 1*b*.

Insulating substrate 2 includes a main circuit pattern 21, an insulating layer 22, a base plate 23, and a separated pattern 29. Main circuit pattern 21, insulating layer 22, and base plate 23 are laminated in this order. Separated pattern 29, insulating layer 22, and base plate 23 are laminated in this order.

Main circuit pattern 21 is opposed to relay board 3. Main circuit pattern 21 is electrically connected to semiconductor chip 1. As will be described later in detail, main circuit pattern 21 at least partially surrounds heat-dissipating component 4 on insulating layer 22.

The material of main circuit pattern 21 is, for example, copper (Cu) or aluminum (Al). The material of main circuit pattern 21 has, for example, a thermal resistance smaller than that of insulating layer 22.

Main circuit pattern 21 includes a first main circuit pattern 21*a* and a second main circuit pattern 21*b*. First main circuit pattern 21*a* and second main circuit pattern 21*b* are disposed on insulating layer 22. First main circuit pattern 21*a* and second main circuit pattern 21*b* are disposed on the same surface of insulating layer 22. First chip 1*a* is electrically connected to first main circuit pattern 21*a*. Second chip 1*b* is electrically connected to second main circuit pattern 21*b*.

In the present embodiment, a direction from first main circuit pattern 21*a* toward second main circuit pattern 21*b* corresponds to an X-axis direction DR1. A direction from main circuit pattern 21 toward semiconductor chip 1 corresponds to a Z-axis direction DR3. A direction intersecting each of X-axis direction DR1 and Z-axis direction DR3 corresponds to a Y-axis direction DR2. In the present embodiment, X-axis direction DR1, Y-axis direction DR2, and Z-axis direction DR3 are orthogonal to one another.

Insulating layer 22 and semiconductor chip 1 sandwich main circuit pattern 21. Insulating layer 22 is disposed on the opposite side of main circuit pattern 21 from semiconductor chip 1. The entirety of main circuit pattern 21 is disposed on insulating layer 22. Insulating layer 22 has a larger area than main circuit pattern 21.

The material of insulating layer 22 may appropriately be determined. The material of insulating layer 22 may be, for example, an inorganic ceramic material such as alumina (aluminum oxide) ($Al_2O_3$), aluminum nitride (AlN), silicon nitride ($Si_3N_4$), silicon dioxide ($SiO_2$), or boron nitride (BN). Insulating layer 22 may contain at least one of microparticles and a filler and a resin material. The at least one of microparticles and a filler is dispersed in the resin material. The at least one material of microparticles and a filler is, for example, an inorganic ceramic material such as alumina (aluminum oxide) ($Al_2O_3$), aluminum nitride (AlN), silicon nitride ($Si_3N_4$), silicon dioxide ($SiO_2$), boron nitride (BN), diamond (C), silicon carbide (SiC), or boron oxide ($B_2O_3$). The at least one material of microparticles and a filler may be, for example, a resin material such as a silicone resin or an acrylic resin. The resin material is, for example, an epoxy resin, a polyimide resin, a silicone resin, or an acrylic resin.

Base plate 23 is disposed on the opposite side of main circuit pattern 21 from semiconductor chip 1. Base plate 23 and main circuit pattern 21 sandwich insulating layer 22. Base plate 23 is disposed below insulating layer 22. The upper surface of base plate 23 is in contact with the lower surface of insulating layer 22. The contact thermal resistance between base plate 23 and insulating layer 22 is preferably small. The material of base plate 23 is, for example, copper (Cu) or aluminum (Al). Base plate 23 desirably has a lower thermal resistance than main circuit pattern 21, insulating layer 22, and separated pattern 29. In this case, base plate 23 can dissipate heat absorbed from other members to the outside of semiconductor module 100.

Separated pattern 29 is disposed on the same side as main circuit pattern 21 with respect to insulating layer 22. Separated pattern 29 is disposed on insulating layer 22. Separated pattern 29 and base plate 23 sandwich insulating layer 22.

The top position of separated pattern 29 may be the same as that of main circuit pattern 21. The distance from relay board 3 to separated pattern 29 may be the same as that from relay board 3 to main circuit pattern 21. The distance from relay board 3 to separated pattern 29 and the distance from relay board 3 to main circuit pattern 21 may be the same as the sum of dimensions of semiconductor chip 1, a first joining member 16*a*, and a second joining member 16*b* along Z-axis direction DR3.

Separated pattern 29 is electrically insulated from main circuit pattern 21. Separated pattern 29 and main circuit pattern 21 are spaced from each other by an insulation distance in both X-axis direction DR1 and Y-axis direction DR2. It should be noted that the insulation distance is a distance such that insulation between two objects is maintained.

Separated pattern 29 is provided in insulating substrate 2 by a semiconductor production process (e.g., etching or the like). The etching may be performed on insulating substrate 2 so that insulating layer 22 is exposed. The top position of separated pattern 29 may be the same as that of main circuit pattern 21.

In the present embodiment, separated pattern 29 includes a first separated pattern 29*a* and a second separated pattern 29*b*. First separated pattern 29*a* is at least partially surrounded by first main circuit pattern 21*a*. Second separated pattern 29*b* is at least partially surrounded by second main circuit pattern 21*b*.

Relay board 3 is opposed to insulating substrate 2. Relay board 3 is spaced from insulating substrate 2 in Z-axis direction DR3. Relay board 3 and main circuit pattern 21 sandwich semiconductor chip 1 in a direction (Z-axis direction DR3) in which insulating layer 22 and semiconductor chip 1 sandwich main circuit pattern 21. Relay board 3 is electrically connected to main circuit pattern 21 through semiconductor chip 1.

Relay board 3 includes a first conductive wiring layer 31, an insulating plate, 32, a second conductive wiring layer 33, and a gate conductive pattern 34. Relay board 3 may further include a conductive pad not shown. Gate conductive pattern 34, second conductive wiring layer 33, insulating plate 32, and first conductive wiring layer 31 are laminated in this order. The material of first conductive wiring layer 31, second conductive wiring layer 33, and gate conductive pattern 34 is, for example, a metal such as copper (Cu) or aluminum (Al). Relay board 3 is constituted as, for example, a double-sided copper clad laminate.

First conductive wiring layer 31 is connected to separated pattern 29 through heat-dissipating component 4. First conductive wiring layer 31 and separated pattern 29 sandwich heat-dissipating component 4. First conductive wiring layer 31 is constituted as a back surface of relay board 3. First conductive wiring layer 31 is opposed to main circuit pattern 21. First conductive wiring layer 31 is opposed to the front surface of insulating substrate 2.

First conductive wiring layer 31 includes a first wiring layer 31*a* and a second wiring layer 31*b*. First wiring layer 31*a* is constituted as an N-side wiring layer. Second wiring layer 31*b* is constituted as an AC-side wiring layer. First wiring layer 31*a* and second wiring layer 31*b* are spaced from each other.

Insulating plate 32 is sandwiched between first conductive wiring layer 31 and second conductive wiring layer 33. The material of insulating plate 32 is, for example, a glass epoxy substrate or a glass composite substrate. The glass epoxy substrate is formed by, for example, thermosetting a glass woven fabric impregnated with an epoxy resin. The glass composite substrate is formed by, for example, thermosetting a glass non-woven fabric impregnated with an epoxy resin.

Second conductive wiring layer 33 is electrically insulated from gate conductive pattern 34. Second conductive wiring layer 33 is constituted as a P-side wiring layer. Second conductive wiring layer 33 and gate conductive pattern 34 are constituted as a front surface of relay board 3.

Gate conductive pattern 34 includes a first gate conductive pattern 34*a* and a second gate conductive pattern 34*b*. First gate conductive pattern 34*a* is electrically connected to first chip 1*a*. Second gate conductive pattern 34*b* is electrically connected to second chip 1*b*.

Semiconductor chip 1 is electrically connected to main circuit pattern 21 and first conductive wiring layer 31. A collector electrode of semiconductor chip 1 is electrically connected to main circuit pattern 21. A source electrode of semiconductor chip 1 is electrically connected to first conductive wiring layer 31 and gate conductive pattern 34. First chip 1*a* is sandwiched between first main circuit pattern 21*a* and first wiring layer 31*a*. Second chip 1*b* is sandwiched between second main circuit pattern 21*b* and second wiring layer 31*b*.

Heat-dissipating component 4 is sandwiched between insulating substrate 2 and relay board 3 in a direction (Z-axis direction DR3) in which insulating layer 22 and semiconductor chip 1 sandwich main circuit pattern 21. Heat-dissipating component 4 is sandwiched between separated pattern 29 of insulating substrate 2 and first conductive wiring layer 31 of relay board 3. As will be described later, heat-dissipating component 4 may be sandwiched between base plate 23 of insulating substrate 2 and first conductive wiring layer 31 of relay board 3. The material of heat-dissipating component 4 is, for example, a metal such as copper (Cu) or aluminum (Al). The heat-dissipating component 4 is constituted from a metallic columnar member. Heat-dissipating component 4 is desirably a metallic column. In the present embodiment, heat-dissipating component 4 is prismatic in shape. Heat-dissipating component 4 may be cylindrical in shape. The shape of heat-dissipating component 4 may appropriately be determined. The thermal resistance of heat-dissipating component 4 is desirably smaller than those of semiconductor chip 1, insulating substrate 2, and relay board 3. Heat-dissipating component 4 is desirably joined to insulating substrate 2 and relay board 3 with solder.

Heat-dissipating component 4 is electrically insulated from semiconductor chip 1 and main circuit pattern 21. Electric current does not flow through heat-dissipating component 4. Semiconductor module 100 is configured so that electric current does not flow through heat-dissipating component 4. Heat-dissipating component 4 is configured so as not to generate heat due to Joule heat.

Heat-dissipating component 4 includes a first member 4*a* and a second member 4*b*. First member 4*a* and second member 4*b* are spaced from each other. First member 4*a* and second member 4*b* are spaced by a distance greater than the dimension of each of first member 4*a* and second member 4*b* in each of the directions. Relay board 3 is connected to insulating substrate 2 through first member 4*a* and second member 4*b*. First member 4*a* is sandwiched between first separated pattern 29*a* and first wiring layer 31*a* in Z-axis direction DR3. Second member 4*b* is sandwiched between second separated pattern 29*b* and second wiring layer 31*b* in Z-axis direction DR3.

Figure 4:
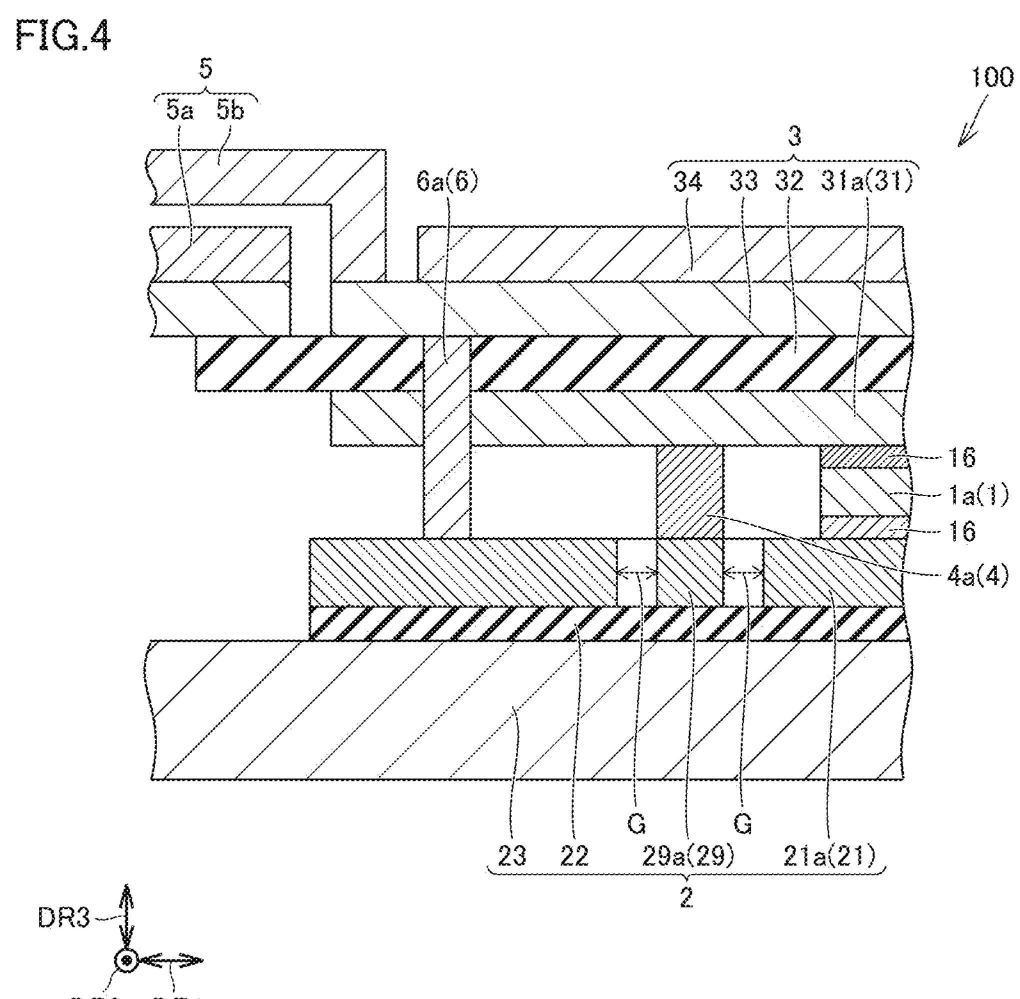
FIG. 4 is an enlarged view of a IV region shown in FIG. 3.
Figure 5:
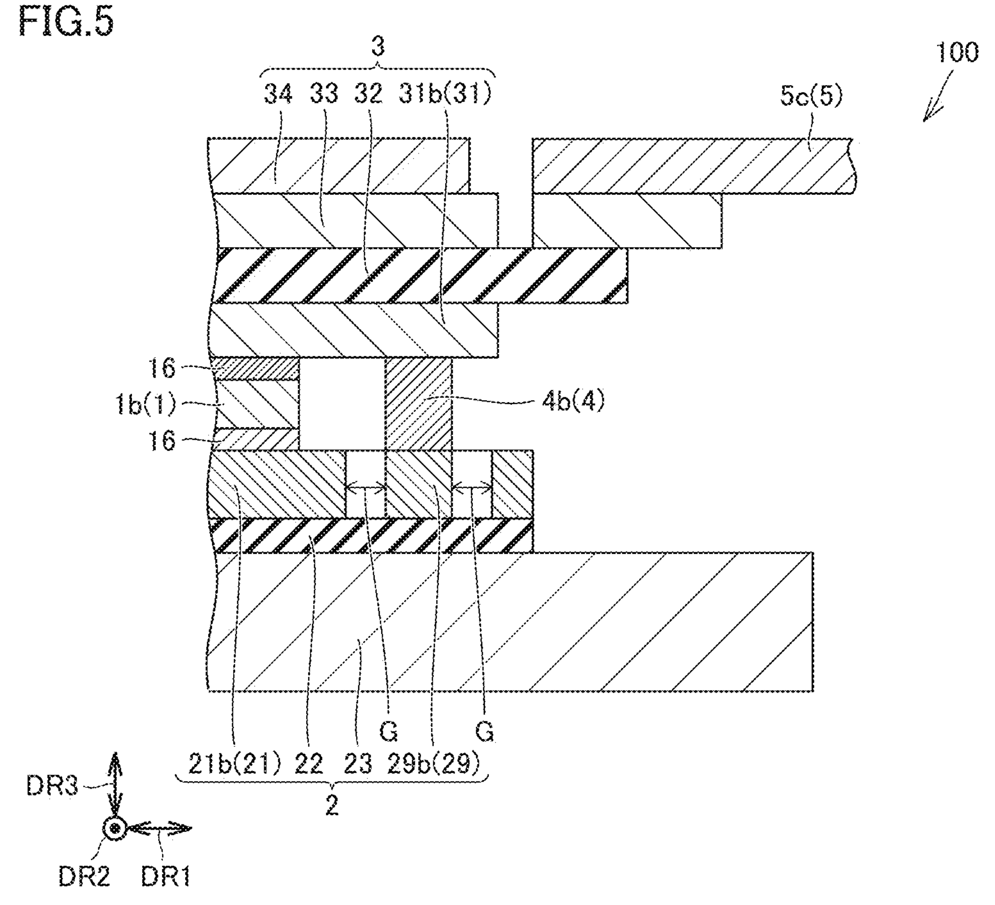
FIG. 5 is an enlarged view of a V region shown in FIG. 3.

As shown in FIG. 4, first member 4*a* is spaced by a gap G from first main circuit pattern 21*a*. As shown in FIG. 5, second member 4*b* is spaced by gap G from second main circuit pattern 21*b*. Gap G is greater than or equal to an insulation distance between heat-dissipating component 4 and main circuit pattern 21.

Figure 6:
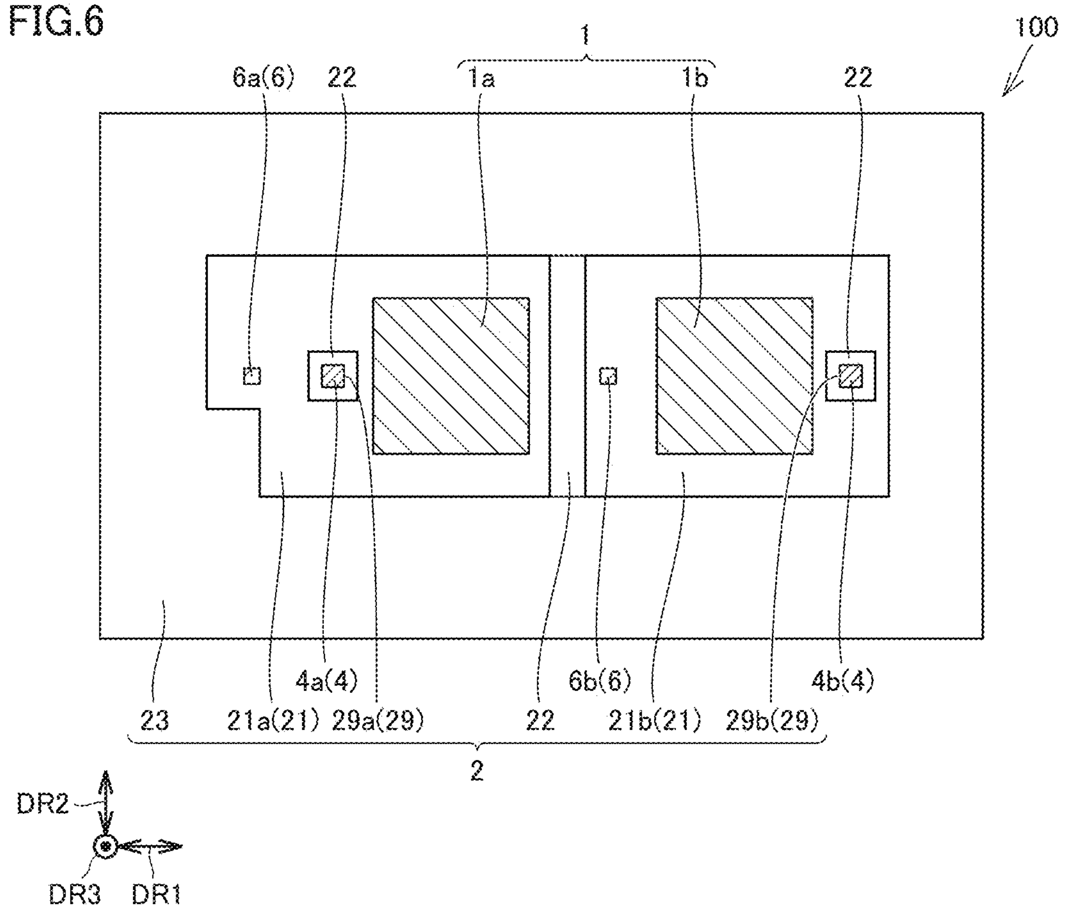
FIG. 6 is a sectional view taken along a line VI-VI shown in FIG. 3.

As shown in FIG. 6, main circuit pattern 21 at least partially surrounds heat-dissipating component 4 on insulating layer 22. In the present embodiment, the phrase "main circuit pattern 21 at least partially surrounds heat-dissipating component 4" means that the side surfaces of main circuit pattern 21 are opposed to the side surfaces of heat-dissipating component 4 in two directions (X-axis direction DR1 and Y-axis direction DR2). Main circuit pattern 21 is opposed to heat-dissipating component 4 in X-axis direction DR1 and is opposed to heat-dissipating component 4 in Y-axis direction DR2. At least two of the side surfaces of main circuit pattern 21 are respectively opposed to at least two side surfaces of heat-dissipating component 4. At least two of the side surfaces of heat-dissipating component 4 are opposed to main circuit pattern 21 with a space between them. When insulating substrate 2 and heat-dissipating component 4 are viewed from the direction (Z-axis direction DR3) in which semiconductor chip 1 is stacked on insulating substrate 2, main circuit pattern 21 at least partially surrounds heat-dissipating component 4.

In the present embodiment, main circuit pattern 21 surrounds the entirety of heat-dissipating component 4 on insulating layer 22. When insulating substrate 2 and heat-dissipating component 4 are viewed from the direction (Z-axis direction DR3) in which the semiconductor chip 1 is stacked on insulating substrate 2, main circuit pattern 21 surrounds the entirety of heat-dissipating component 4. When insulating substrate 2 and heat-dissipating component 4 are viewed from the direction (Z-axis direction DR3) in which the semiconductor chip 1 is stacked on insulating substrate 2, main circuit pattern 21 surrounds all the side surfaces of heat-dissipating component 4. All the side surfaces of heat-dissipating component 4 may be opposed to main circuit pattern 21 with a space between them.

As shown in FIG. 3, electrode terminal 5 is connected to relay board 3. Electrode terminal 5 is electrically connected to relay board 3. Electrode terminal 5 protrudes from relay board 3 in a direction opposite to insulating substrate 2. Electrode terminal 5 has a portion extending in Z-axis direction DR3. Electrode terminal 5 may electrically be connected to an external device not shown. The material of electrode terminal 5 is, for example, a metal such as copper (Cu) or aluminum (Al).

Electrode terminal 5 includes a first terminal 5*a*, a second terminal 5*b*, a third terminal 5*c*, and a fourth terminal 5*d* (see FIG. 2). First terminal 5*a* and second terminal 5*b* are electrically connected to first chip 1*a*. Third terminal 5*c* and fourth terminal 5*d* (see FIG. 2) are electrically connected to second chip 1*b*.

First terminal 5*a* is joined to a conductive pad provided in relay board 3 with a conductive joining material such as solder. First terminal 5*a* is electrically connected to the source electrode of semiconductor chip 1 through the conductive pad, conductive post 6, first wiring layer 31*a*, and the conductive joining material. First terminal 5*a* is constituted as a terminal of the source electrode.

Second terminal 5*b* is joined to second conductive wiring layer 33 with a conductive joining material such as solder. Second terminal 5*b* is electrically connected to the drain electrode of semiconductor chip 1 through second conductive wiring layer 33, conductive post 6, main circuit pattern 21, and the conductive joining material. Second terminal 5*b* is constituted as a terminal of the drain electrode. Part of main circuit pattern 21 is constituted as a pattern of the drain electrode. Main circuit pattern 21 includes a pattern of the drain electrode.

Insulating substrate 2 and relay board 3 are electrically connected to each other through conductive post 6. Conductive post 6 is electrically connected to second conductive wiring layer 33. Conductive post 6 passes through first conductive wiring layer 31 and insulating plate 32. Conductive post 6 intrudes into relay board 3. Conductive post 6 is electrically connected to main circuit pattern 21 and second conductive wiring layer 33. Conductive post 6 supports relay board 3. Conductive post 6 is fixed to main circuit pattern 21 and second conductive wiring layer 33 with a conductive joining material such as solder. The material of conductive post 6 is, for example, a metal such as copper (Cu) or aluminum (Al).

Conductive post 6 includes a first post 6*a* and a second post 6*b*. First post 6*a* is electrically connected to first main circuit pattern 21*a* and first wiring layer 31*a*. Second post 6*b* is electrically connected to second main circuit pattern 21*b* and second wiring layer 31*b*.

Semiconductor module 100 further includes a joining member 16. Joining member 16 is, for example, a conductive joining member such as solder, a metallic microparticle sintered body, or a conductive adhesive. The solder is, for example, tin (Sn)-silver (Ag)-indium (In)-based solder or tin (Sn)-silver (Ag)-copper (Cu)-based solder. The metallic microparticle sintered body is, for example, a silver (Ag) nanoparticle sintered body.

Joining member 16 include a first joining member 16*a* and a second joining member 16*b*. Semiconductor chip 1 is fixed to main circuit pattern 21 with first joining member 16*a*. Semiconductor chip 1 is fixed to the conductive wiring layer with second joining member 16*b*.

As shown in FIG. 1, semiconductor module 100 may further include a first conductive wire 90, a second conductive wire 91, a source control terminal 92, a gate control terminal 93, a thermistor 95, a thermistor terminal 96, a metallic bridge 97, a drain sense terminal not shown, and an insert case not shown.

First conductive wire 90 is bonded to the gate electrode of semiconductor chip 1 and gate conductive pattern 34. The material of first conductive wire 90 is, for example, a metal such as gold (Au), silver (Ag), copper (Cu), or aluminum (Al).

Second conductive wire 91 is bonded to gate conductive pattern 34 and gate control terminal 93. The material of second conductive wire 91 is, for example, a metal such as gold (Au), silver (Ag), copper (Cu), or aluminum (Al). Gate conductive pattern 34 is electrically connected to gate control terminal 93 through second conductive wire 91. A gate electrode is supplied to gate control terminal 93 from the outside of semiconductor module 100. Gate control terminal 93 is provided on, for example, an insulating block placed on base plate 23. The material of gate control terminal 93 is, for example, a metal such as copper (Cu) or aluminum (Al). Gate control terminal 93 is electrically connected to the gate electrode of semiconductor chip 1 though second conductive wire 91, gate conductive pattern 34, and first conductive wire 90. Metallic bridge 97 connects first gate conductive pattern 34*a* and second gate conductive pattern 34*b*.

Figure 7:
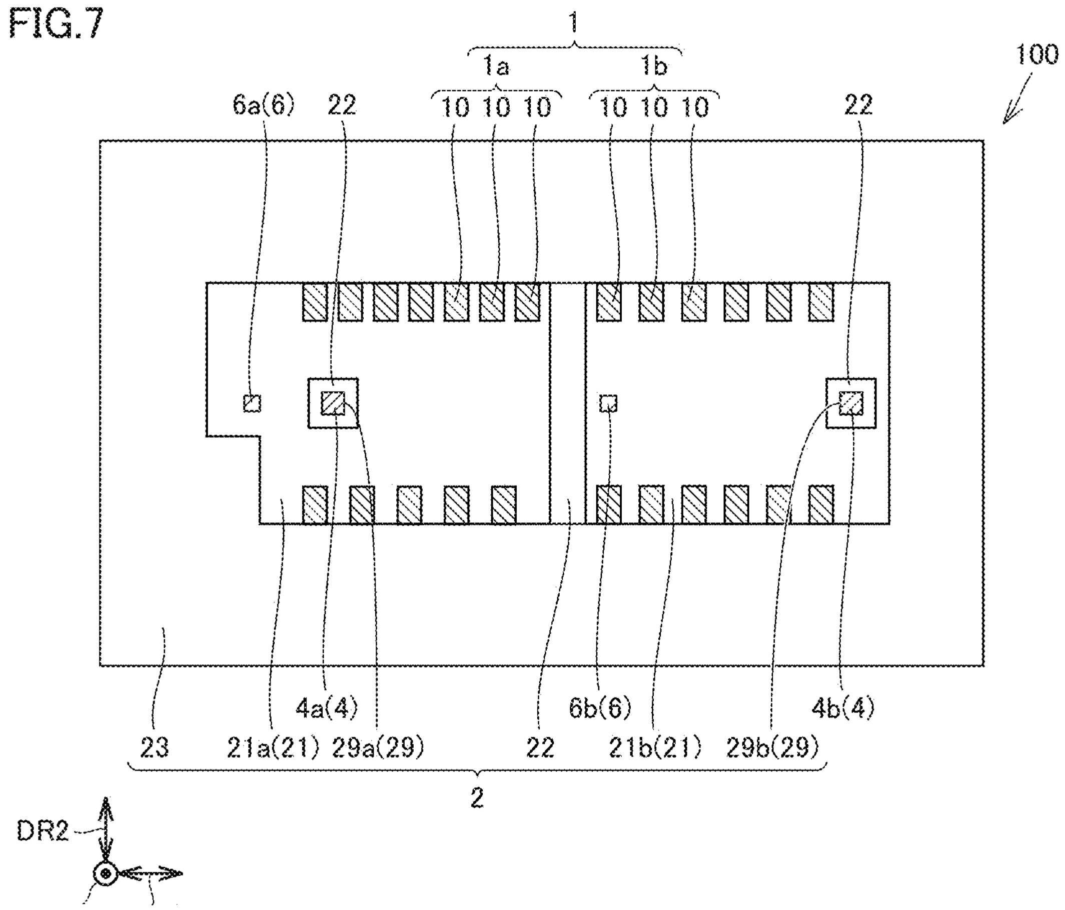
FIG. 7 is a sectional view schematically showing the configuration of a semiconductor module according to a second modification of Embodiment 1.

As shown in FIG. 7, first chip 1*a* and second chip 1*b* may each include a plurality of chips 10. Chips 10 are spaced from each other. Chips 10 of first chip 1*a* are electrically connected in parallel to each other. Chips 10 of second chip 1*b* are electrically connected in parallel to each other. Semiconductor chips 1 are connected by multiple parallel connection because first chip 1*a* and second chip 1*b* are electrically connected in parallel. The number of chips 10 is not limited to 12, and may appropriately be determined.

Figure 8:
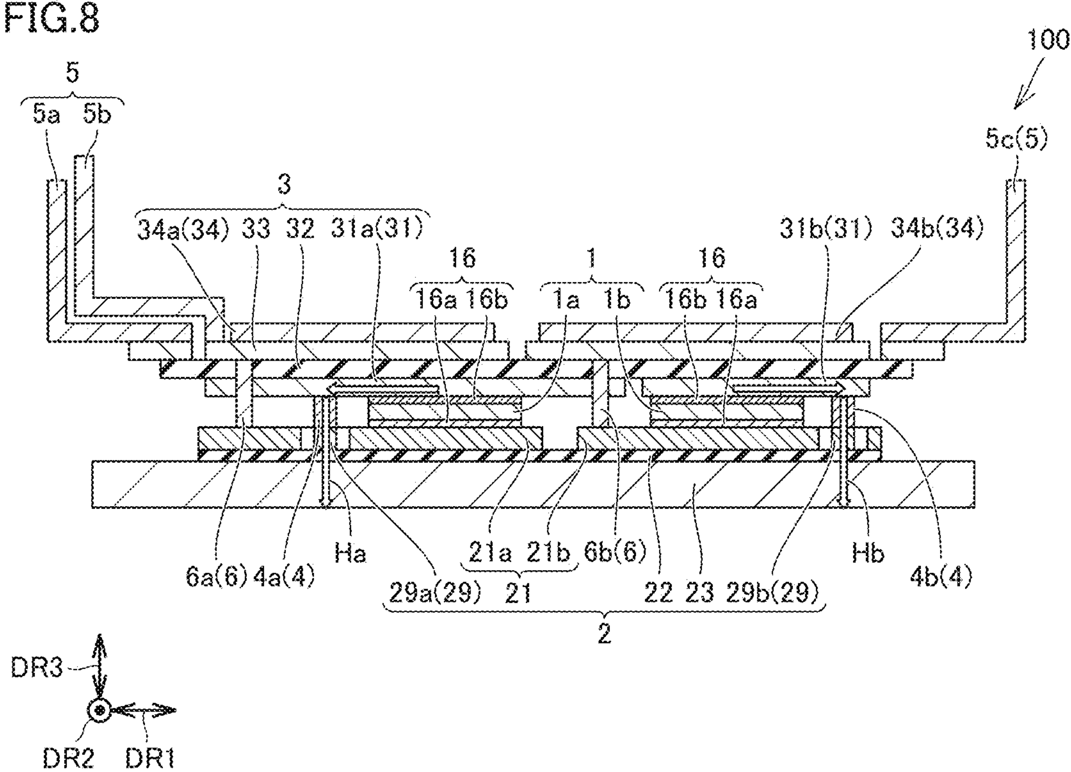
FIG. 8 is a sectional view schematically showing a heat-dissipating path of the semiconductor module according to the first modification of Embodiment 1.

With reference to FIG. 8, heat Ha, Hb generated in semiconductor module 100 according to Embodiment 1 will be described.

During operation of semiconductor module 100, electric current flows through semiconductor chip 1. Therefore, semiconductor chip 1 generates heat due to Joule heat. The heat generated in semiconductor chip 1 is transmitted particularly to first conductive wiring layer 31 (first wiring layer 31*a* and second wiring layer 31*b*) of relay board 3. The heat transmitted to relay board 3 is transmitted to insulating substrate 2 through heat-dissipating component 4. The heat transmitted to insulating substrate 2 is dissipated from base plate 23 to the outside of semiconductor module 100. Open arrows indicate a path through which heat Ha, Hb generated in semiconductor module 100 is dissipated.

The temperature of first conductive wiring layer 31 (first wiring layer 31*a* and second wiring layer 31*b*) may increase due to heat generation of semiconductor chip 1. Further, the temperature of first terminal 5*a* electrically connected to first wiring layer 31*a* and the temperature of second terminal 5*b* electrically connected to second wiring layer 31*b* may increase.

During operation of semiconductor module 100, electric current flows through first conductive wiring layer 31. Therefore, Joule heat is generated in first conductive wiring layer 31. That is, first conductive wiring layer 31 generates heat. Electric current flows through first terminal 5*a* and third terminal 5*c* to the outside, and therefore first terminal 5*a* and third terminal 5*c* also generate heat.

The heat generated from first conductive wiring layer 31 is dissipated through any of semiconductor chip 1, first terminal 5*a*, third terminal 5*c*, and heat-dissipating component 4. Particularly, since electric current does not flow through heat-dissipating component 4, heat-dissipating component 4 does not generate heat due to Joule heat. Thus, the thermal resistance of heat-dissipating component 4 does not increase. Therefore, heat dissipation through heat-dissipating component 4 makes it possible to prevent the temperature rise of semiconductor chip 1, first terminal 5*a*, and third terminal 5*c*. This makes it possible to prevent the temperature rise of semiconductor module 100 even when semiconductor module 100 operates under conditions close to a rated current and a rated voltage while generating high heat.

It should be noted that if the temperatures of semiconductor chip 1, first terminal 5*a*, and third terminal 5*c* increase, the superiority of semiconductor module 100 having insulating substrate 2 and relay board 3 may be canceled out. The superiority is, for example, increased current density and high integration.

Hereinbelow, the function and effect of the present embodiment will be described.

In semiconductor module 100 according to the present embodiment, as shown in FIG. 6, main circuit pattern 21 at least partially surrounds heat-dissipating component 4 on insulating layer 22. Therefore, main circuit pattern 21 is opposed to heat-dissipating component 4 in X-axis direction DR1 and is opposed to heat-dissipating component 4 in Y-axis direction DR2. This makes it possible to increase the area of main circuit pattern 21 as compared to a case where main circuit pattern 21 is opposed to heat-dissipating component 4 only in one of X-axis direction DR1 and Y-axis direction DR2. Main circuit pattern 21 can be disposed so as to protrude toward the sides of heat-dissipating component 4. This makes it possible to reduce restrictions on the design layout of insulating substrate 2. Thus, it is possible to reduce restrictions on the design layout of semiconductor module 100. This makes it possible to respond increased current density resulting from multiple parallelization of semiconductor chips 1.

As shown in FIG. 3, heat-dissipating component 4 is electrically insulated from semiconductor chip 1 and main circuit pattern 21. Therefore, during operation of semiconductor module 100, electric current does not flow through heat-dissipating component 4. This makes it possible to more efficiently dissipate heat generated in semiconductor chip 1 and relay board 3 through heat-dissipating component 4 as compared to a case where electric current flows through heat-dissipating component 4. Thus, it is possible to prevent the temperature rise of semiconductor module 100. Specifically, it is possible to prevent the temperature rise of first conductive wiring layer 31 and electrode terminal 5. This makes it possible to enhance the reliability of semiconductor module 100.

As shown in FIG. 3, heat-dissipating component 4 is sandwiched between separated pattern 29 and relay board 3. Therefore, heat generated in relay board 3 can be dissipated from separated pattern 29. This makes it possible to enhance heat dissipation of semiconductor module 100.

As shown in FIG. 3, electrode terminal 5 protrudes from relay board 3 in a direction opposite to insulating substrate 2. Therefore, heat generated in relay board 3 can be dissipated from electrode terminal 5.

As shown in FIG. 3, heat-dissipating component 4 may be a metallic column. In this case, heat dissipation of heat-dissipating component 4 can be enhanced as compared to a case where the heat-dissipating component 4 is not a metallic column.

Embodiment 2

Hereinbelow, the configuration of a semiconductor module 100 according to Embodiment 2 will be described with reference to FIG. 9 to FIG. 14. Embodiment 2 has the same configuration, function, and effect as Embodiment 1 described above unless otherwise specified. Therefore, the same reference signs are assigned to the same components as Embodiment 1 described above, and the description of the same components will not be repeated.

Figure 9:
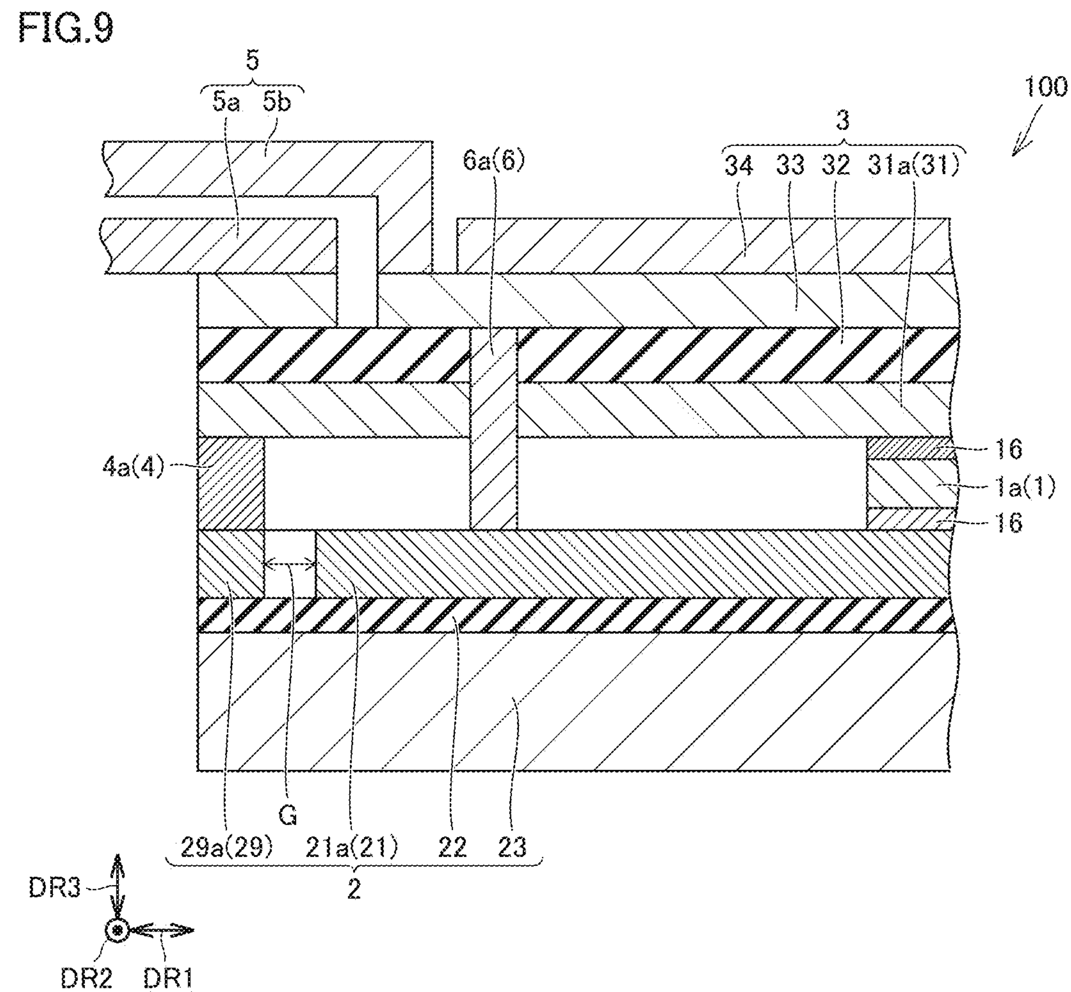
FIG. 9 is a sectional view schematically showing the configurations of a first chip, an insulating substrate, a relay board, a first member, a first terminal, and a second terminal of a semiconductor module according to Embodiment 2.

As shown in FIG. 9, an electrode terminal 5 of semiconductor module 100 according to the present embodiment and a heat-dissipating component 4 sandwich a relay board 3. Heat-dissipating component 4 and the root of electrode terminal 5 sandwich relay board 3. Heat-dissipating component 4 is disposed directly below electrode terminal 5.

Figure 10:
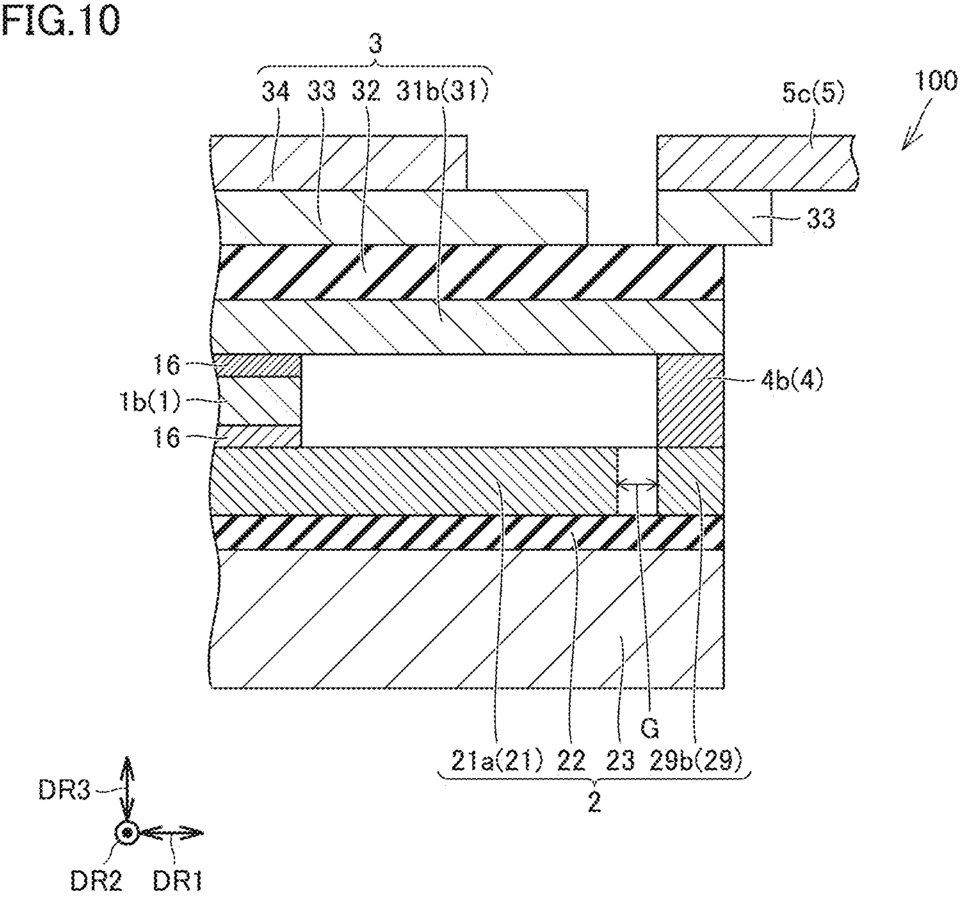
FIG. 10 is a sectional view schematically showing the configurations of a second chip, an insulating substrate, a relay board, a second member, and a third terminal of the semiconductor module according to Embodiment 2.

Specifically, as shown in FIG. 9, a first terminal 5*a* and a first member 4*a* sandwich relay board 3. As shown in FIG. 10, a third terminal 5*c* and a second member 4*b* sandwich relay board 3.

Figure 11:
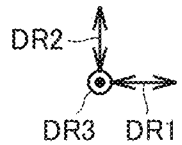
FIG. 11 is a sectional view schematically showing the configuration of the semiconductor module according to Embodiment 2.

As shown in FIG. 11, three of the side surfaces of heat-dissipating component 4 are surrounded by a main circuit pattern 21. Three of the side surfaces of first member 4*a* is surrounded by a first main circuit pattern 21*a*. Three of the side surfaces of second member 4*b* is surrounded by a second main circuit pattern 21*b*.

Figure 12:
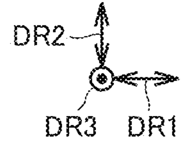
FIG. 12 is a sectional view schematically showing the configuration of a semiconductor module according to a first modification of Embodiment 2.

As shown in FIG. 12, two of the side surfaces of heat-dissipating component 4 may be surrounded by main circuit pattern 21. Four (all) side surfaces of heat-dissipating component 4 may be surrounded by main circuit pattern 21. Specifically, two of the side surfaces of first member 4*a* may be surrounded by first main circuit pattern 21*a*. Four (all)

side surfaces of second member 4*b* may be surrounded by second main circuit pattern 21*b*.

Figure 13:
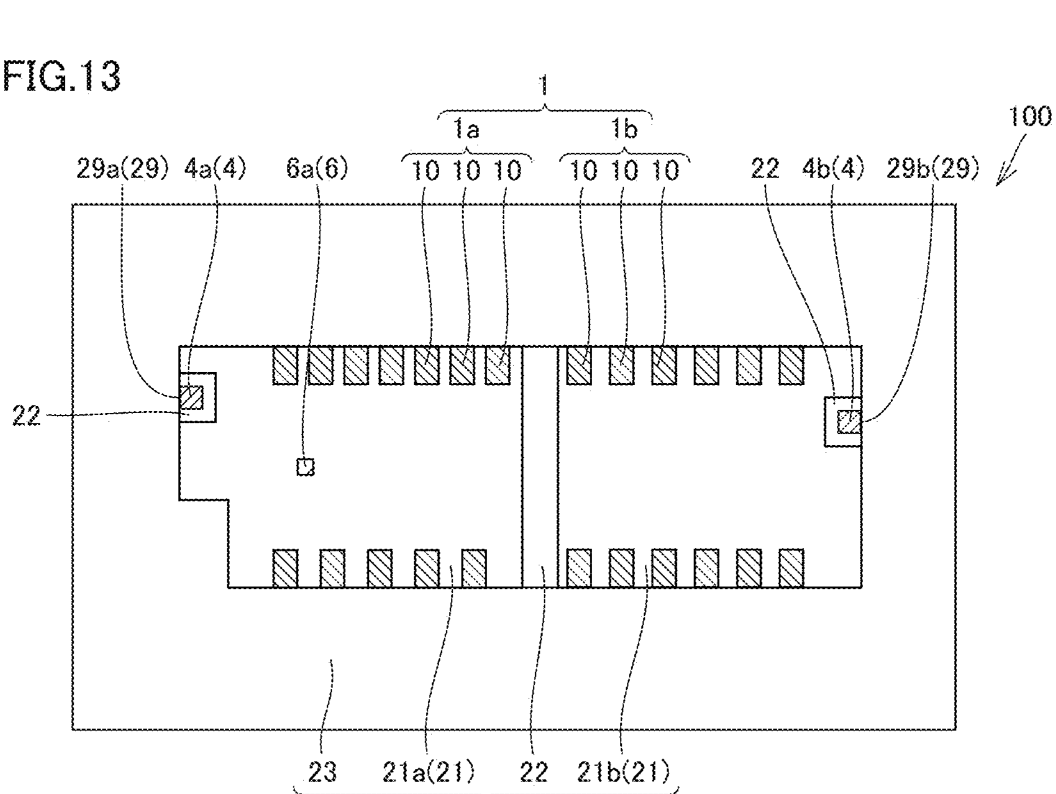
FIG. 13 is a sectional view schematically showing the configuration of a semiconductor module according to a second modification of Embodiment 2.
Figure 14:
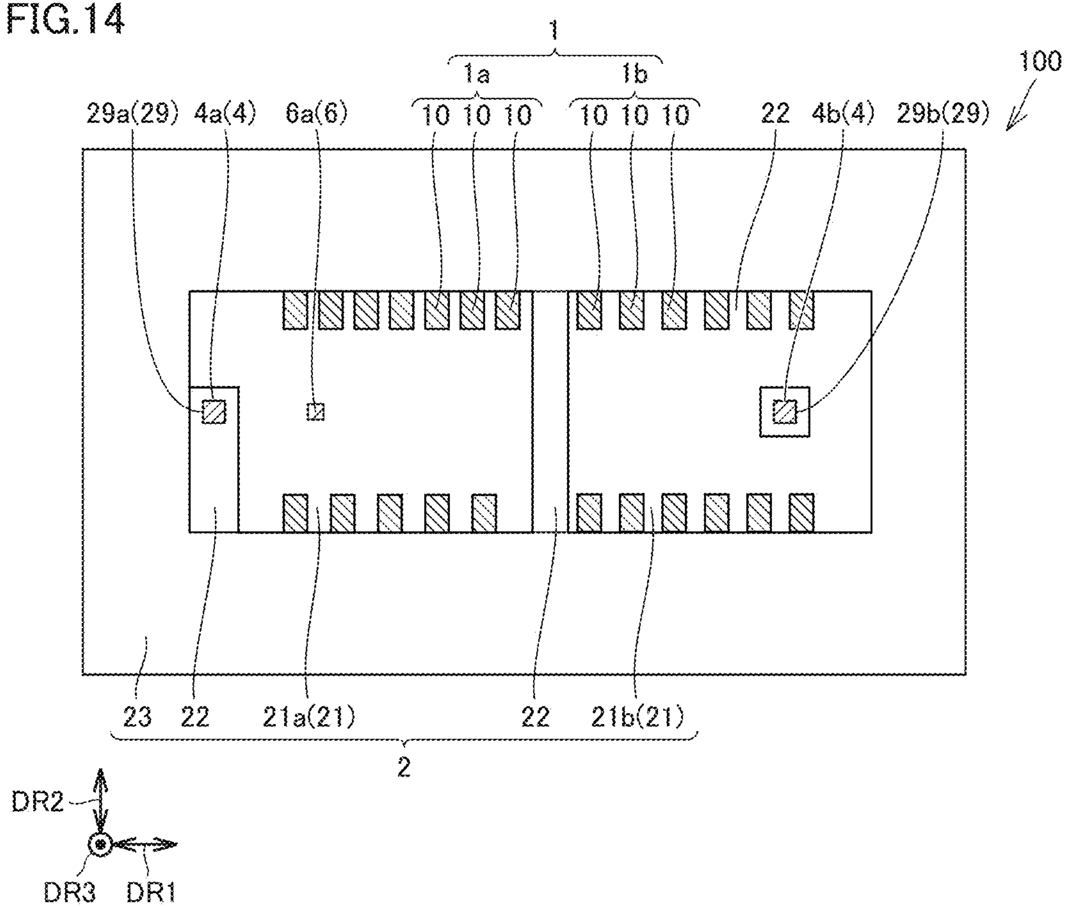
FIG. 14 is a sectional view schematically showing the configuration of a semiconductor module according to a third modification of Embodiment 2.

As shown in FIG. 13 and FIG. 14, first chip 1*a* and second chip 1*b* may be connected in multi-parallel through chips 10.

Hereinbelow, the function and effect of the present embodiment will be described.

As shown in FIG. 9 and FIG. 10, in semiconductor module 100 according to the present embodiment, electrode terminal 5 and heat-dissipating component 4 sandwich relay board 3. This makes it possible to shorten a heat-dissipating path from electrode terminal 5 to heat-dissipating component 4 as compared to a case where electrode terminal 5 and heat-dissipating component 4 do not sandwich relay board 3 (see FIG. 4 and FIG. 5). Therefore, heat of electrode terminal 5 can more efficiently be removed as compared to a case where electrode terminal 5 and heat-dissipating component 4 do not sandwich relay board 3 (see FIG. 4 and FIG. 5). Generally, in semiconductor module 100, heat of electrode terminal 5 is most difficult to dissipate. When electrode terminal 5 and heat-dissipating component 4 sandwich relay board 3, heat of semiconductor module 100 can efficiently be removed even under conditions such as high integration of semiconductor chip 1 or high-speed driving of semiconductor chip 1 made of silicon carbide (SiC).

Embodiment 3

Hereinbelow, the configuration of a semiconductor module 100 according to Embodiment 3 will be described with reference to FIG. 15 and FIG. 16. Embodiment 3 has the same configuration, function, and effect as Embodiment 1 described above unless otherwise specified. Therefore, the same reference signs are assigned to the same components as Embodiment 1 described above, and the description of the same components will not be repeated.

Figure 15:
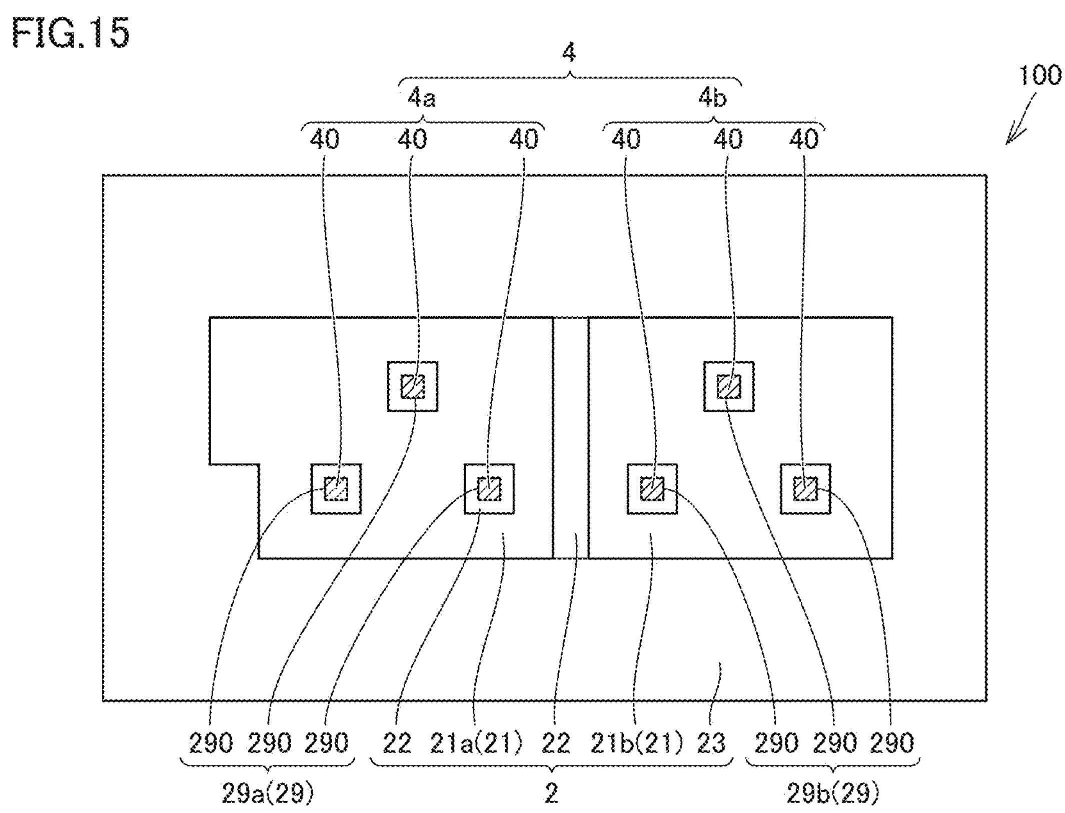
FIG. 15 is a sectional view schematically showing the configuration of a semiconductor module according to Embodiment 3.

As shown in FIG. 15, in semiconductor module 100 according to the present embodiment, a relay board 3 (see FIG. 1) is connected to an insulating substrate 2 through a first member 4*a* and a second member 4*b*. It should be noted that for the purpose of illustration, a semiconductor chip 1 (see FIG. 1) is not shown in FIG. 15. First member 4*a* and second member 4*b* each include a plurality of heat-dissipating parts 40. Relay board 3 is connected to insulating substrate 2 through heat-dissipating parts 40. It is desirable that heat-dissipating parts 40 be spaced from each other by a distance greater than the dimension of each of heat-dissipating parts 40 in each of the directions. Heat-dissipating parts 40 are each electrically insulated from semiconductor chip 1 and a main circuit pattern 21. First member 4*a* and second member 4*b* each have, for example, three heat-dissipating parts 40, but the number of heat-dissipating parts 40 may appropriately be determined.

A first separated pattern 29*a* and a second separated pattern 29*b* each include a plurality of separated portions 290. Separated portions 290 are respectively joined to heat-dissipating parts 40. It is desirable that separated portions 290 be spaced from each other by a distance greater than the dimension of each of separated portions 290 in each of the directions.

It should be noted that if the gap between separated portions 290 is smaller than the dimension of each of separated portions 290 in each of the directions, heat is only locally dissipated to insulating substrate 2 so that a heat-dissipating effect may reduce. Further, heat concentratively flows into heat-dissipating component 4 so that the thermal resistance may partly increase. Therefore, it is desirable that separated portions 290 be spaced from each other by a distance greater than the dimension of each of separated portions 290 in each of the directions.

The number of separated portions 290 is not limited to three, and may appropriately be determined. The shape of each of separated portions 290 is not limited to a rectangular shape, and may appropriately be determined. The aspect ratio of each of separated portions 290 may appropriately be determined. The area of each of separated portions 290 may be smaller than that of separated pattern 29 shown in FIG. 6. The distance between separated portions 290, the area of each of separated portions 290, and the number of separated portions 290 may appropriately be determined according to restrictions on the layout of semiconductor module 100.

It is desirable that separated portion 290 disposed directly below electrode terminal 5 (see FIG. 1) have a larger area than separated portion 290 disposed not directly below electrode terminal 5 (see FIG. 1). In this case, heat dissipation of electrode terminal 5 (see FIG. 1) enhances.

It should be noted that layout may further be limited as the number of separated portions 290 increases. Therefore, it is desirable that the number of separated portions 290 and the area of each of separated portions 290 be designed according to the temperature of semiconductor chip 1 so that layout restrictions are not limited. It is desirable that the number of separated portions 290 and the area of each of separated portions 290 be designed so that the influence of heat on relay board 3 (see FIG. 1) and electrode terminal 5 (see FIG. 1) reduces. For example, it is desirable that separated portion 290 connected to chip 10 that will have the highest temperature among chips 10 have a larger area than other separated portions 290.

It should be noted that also in the present embodiment, it is desirable that, similarly to Embodiment 2, electrode terminal 5 (see FIG. 10) and heat-dissipating component 4 sandwich relay board 3 (see FIG. 10). In the present embodiment, it is desirable that electrode terminal 5 (see FIG. 10) and at least one of heat-dissipating parts 40 sandwich relay board 3 (see FIG. 10). It is more desirable that electrode terminal 5 (see FIG. 10) and heat-dissipating parts 40 sandwich relay board 3 (see FIG. 10). For example, a third terminal 5*c* (see FIG. 10) and heat-dissipating parts 40 may sandwich relay board 3 (see FIG. 10). In this case, heat dissipation of third terminal 5*c* (see FIG. 10) enhances as compared to a case where third terminal 5*c* (see FIG. 10) and one heat-dissipating part 40 sandwich relay board 3 (see FIG. 10).

Figure 16:
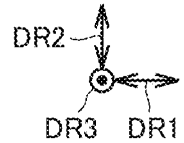
FIG. 16 is a sectional view schematically showing the configuration of a semiconductor module according to a modification of Embodiment 3.

As shown in FIG. 16, first chip 1*a* and second chip 1*b* may be connected in multi-parallel through chips 10.

Hereinbelow, the function and effect of the present embodiment will be described.

As shown in FIG. 15, in semiconductor module 100 according to the present embodiment, relay board 3 (see FIG. 1) is connected to insulating substrate 2 through first member 4*a* and second member 4*b*. Therefore, the number of heat-dissipating paths for relay board 3 can be increased as compared to a case where relay board 3 (see FIG. 1) is connected to insulating substrate 2 through a single member. This makes it possible to enhance heat dissipation of relay board 3 (see FIG. 1).

As shown in FIG. 15, first member 4*a* and second member 4*b* each include heat-dissipating parts 40. Relay board 3 (see FIG. 1) is connected to insulating substrate 2 through heat-dissipating parts 40. Therefore, the number of heat-dissipating paths for relay board 3 (see FIG. 1) can be increased as compared to a case where relay board 3 (see FIG. 1) is connected to insulating substrate 2 through a single first member 4*a* and a single second member 4*b*. This makes it possible to enhance heat dissipation of relay board 3 (see FIG. 1).

Embodiment 4

Hereinbelow, the configuration of a semiconductor module 100 according to Embodiment 4 will be described with reference to FIG. 17. Embodiment 4 has the same configuration, function, and effect as Embodiment 1 described above unless otherwise specified. Therefore, the same reference signs are assigned to the same components as Embodiment 1 described above, and the description of the same components will not be repeated.

Figure 17:
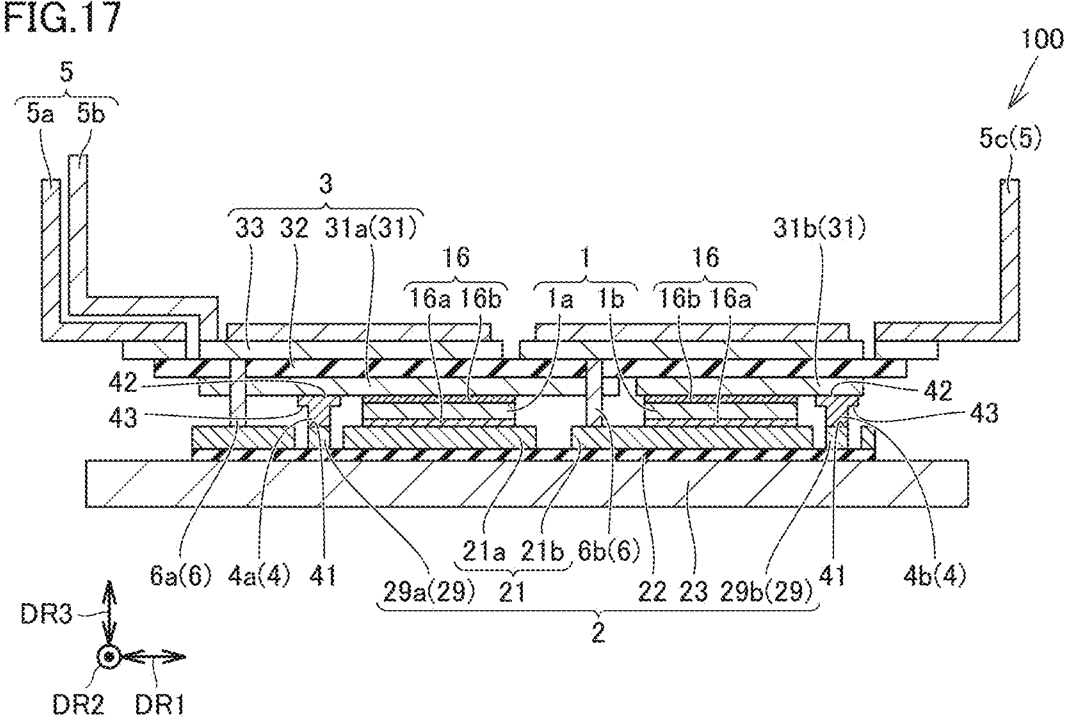
FIG. 17 is a sectional view schematically showing the configuration of a semiconductor module according to Embodiment 4.

As shown in FIG. 17, a heat-dissipating component 4 of semiconductor module 100 according to the present embodiment includes a first surface 41, a second surface 42, and a third surface 43. First surface 41 is joined to an insulating substrate 2. First surface 41 is joined to a separated pattern 29.

Second surface 42 is opposed to first surface 41. Second surface 42 is joined to relay board 3. Second surface 42 is joined to a first conductive wiring layer 31. Second surface 42 has a larger area than first surface 41.

Third surface 43 is disposed between first surface 41 and second surface 42 at a position in the height direction (Z-axis direction DR3). Third surface 43 is spaced from insulating substrate 2 and relay board 3. Third surface 43 is spaced from a main circuit pattern 21 by an insulation distance or more. It should be noted that when a sufficient gap cannot be kept between third surface 43 and main circuit pattern 21, an insulating material may be disposed between third surface 43 and main circuit pattern 21. The insulating material is, for example, a polyimide.

When heat-dissipating component 4 is viewed in X-axis direction DR1 or Y-axis direction DR2, heat-dissipating component 4 has, for example, a T-shaped side surface. Second surface 42 protrudes beyond first surface 41 in X-axis direction DR1. Although not shown, second surface 42 may protrude beyond first surface 41 in Y-axis direction DR2. Further, second surface 42 may protrude beyond first surface 41 in each of X-axis direction DR1 and Y-axis direction DR2.

Hereinbelow, the function and effect of the present embodiment will be described.

As shown in FIG. 17, in semiconductor module 100 according to the present embodiment, second surface 42 of heat-dissipating component 4 has a larger area than first surface 41. Therefore, heat of relay board 3 is more easily transmitted to heat-dissipating component 4 as compared to a case where first surface 41 and second surface 42 have the same area. This makes it possible to enhance heat dissipation of relay board 3 and electrode terminal 5 connected to relay board 3.

Embodiment 5

Hereinbelow, the configuration of a semiconductor module 100 according to Embodiment 5 will be described with reference to FIG. 18. Embodiment 5 has the same configuration, function, and effect as Embodiment 1 described above unless otherwise specified. Therefore, the same reference signs are assigned to the same components as Embodiment 1 described above, and the description of the same components will not be repeated.

Figure 18:
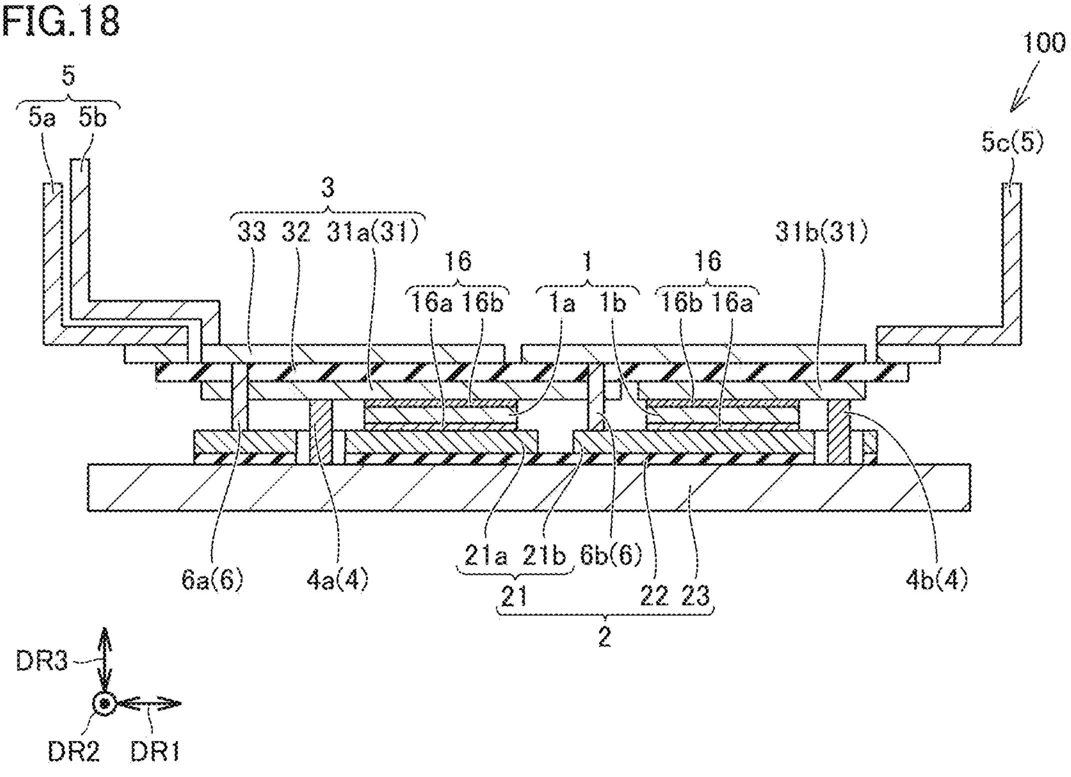
FIG. 18 is a sectional view schematically showing the configuration of a semiconductor module according to Embodiment 5.

As shown in FIG. 18, an insulating substrate 2 of semiconductor module 100 according to the present embodiment does not include a separated pattern 29 (see FIG. 3). A heat-dissipating component 4 is directly connected to a base plate 23. Heat-dissipating component 4 is connected to base plate 23 without interposing separated pattern 29 (see FIG. 3) and an insulating layer 22 between them. Heat-dissipating component 4 may be joined to base plate 23 with solder. Heat-dissipating component 4 may be welded to base plate 23. A method for connecting heat-dissipating component 4 and base plate 23 may appropriately be determined as long as the thermal conductivity of heat-dissipating component 4 is maintained. The material of heat-dissipating component 4 may be the same as that of base plate 23. Heat-dissipating component 4 may integrally be formed with base plate 23.

It should be noted that heat dissipation is enhanced by increasing the joint area of heat-dissipating component 4. Further, heat dissipation is enhanced by disposing heat-dissipating component 4 at a position where the amount of heat is concentrated.

Hereinbelow, a method for producing semiconductor module 100 according to Embodiment 5 will be described.

A main circuit pattern 21 and an insulating layer 22 of an insulating substrate 2 are etched. Specifically, main circuit pattern 21 and insulating layer 22 are etched so that a region in a base plate 23, to which a heat-dissipating component 4 can be connected, is exposed from main circuit pattern 21 and insulating layer 22. Main circuit pattern 21 and insulating layer 22 are etched so that heat-dissipating component 4 is spaced from main circuit pattern 21 by an insulation distance or more. It should be noted that the depth of etching is the sum of the thickness of main circuit pattern 21 and the thickness of insulating layer 22.

The upper surface of heat-dissipating component 4 is joined to a first conductive wiring layer 31 with a conductive joining material not shown such as a solder material. Heat-dissipating component 4 may be used to adjust the height of a relay board 3. In this case, the production process can be simplified.

It should be noted that the combined use of direct connection of heat-dissipating component 4 to base plate 23 according to the present embodiment and connection through separated pattern 29 (see FIG. 3) is not desirable because the process becomes complicated and the cost increases.

Hereinbelow, the function and effect of the present embodiment will be described.

As shown in FIG. 18, in semiconductor module 100 according to the present embodiment, heat-dissipating component 4 is directly connected to base plate 23. Therefore, the thermal resistance can be made smaller as compared to a case where heat-dissipating component 4 is connected to base plate 23 through separated pattern 29 (see FIG. 3) and insulating layer 22. Particularly, when heat-dissipating component 4 is connected to base plate 23 through insulating layer 22, the thermal resistance of semiconductor module 100 is increased by the thermal resistance of insulating layer 22. In the case of the present embodiment, heat-dissipating component 4 is connected to base plate 23 without interposing insulating layer 22 between them, and therefore it is possible to prevent the thermal resistance from being increased by insulating layer 22.

As shown in FIG. 18, heat-dissipating component 4 is directly connected to base plate 23. This eliminates the need for an additional production process for connecting heat-dissipating component 4. This makes it possible to prevent the flexibility of layout design from being impaired.

Embodiment 6

Hereinbelow, the configuration of a semiconductor module 100 according to Embodiment 6 will be described with reference to FIG. 19. Embodiment 6 has the same configuration, function, and effect as Embodiment 1 described above unless otherwise specified. Therefore, the same reference signs are assigned to the same components as Embodiment 1 described above, and the description of the same components will not be repeated.

Figure 19:
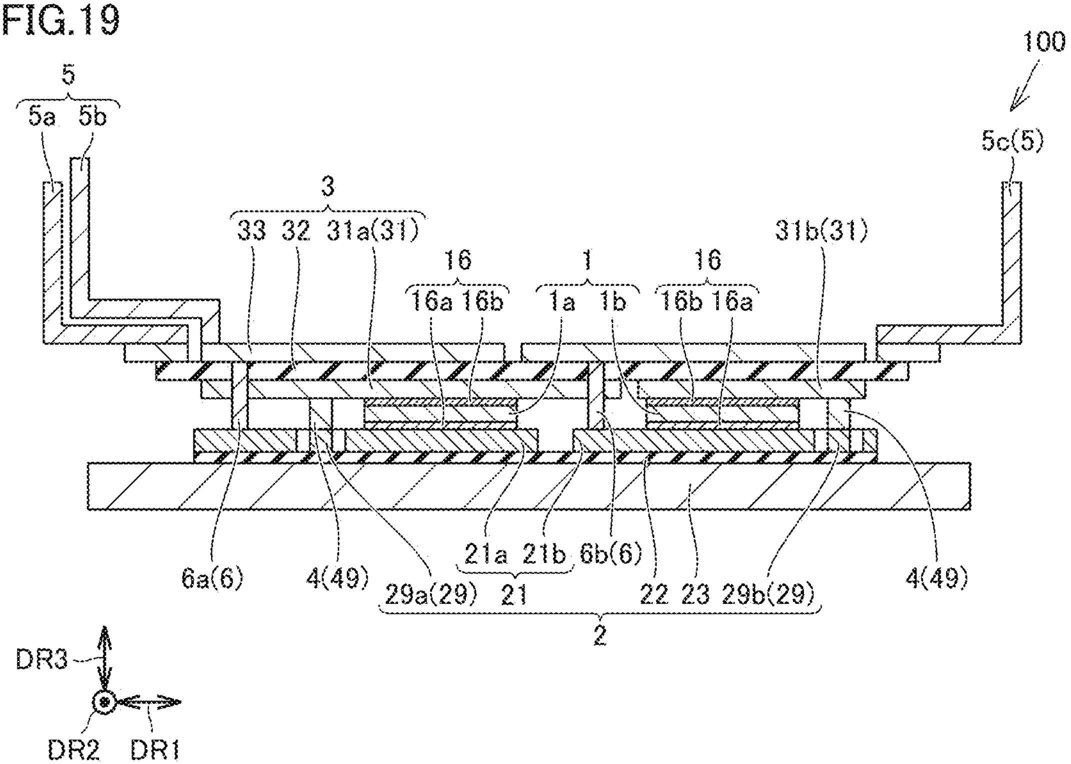
FIG. 19 is a sectional view schematically showing the configuration of a semiconductor module according to Embodiment 6.

As shown in FIG. 19, a heat-dissipating component 4 of semiconductor module 100 according to the present embodiment is constituted from a semiconductor element 49 having a structure that is the same as or different from that of a semiconductor chip 1. Semiconductor element 49 may appropriately be determined. Semiconductor element 49 is, for example, a transistor, a metal oxide semiconductor field effect transistor (MOSFET), a diode, an amplifier, a filter, or a memory. Semiconductor element 49 may be an integrated circuit (IC) obtained by combination of at least any of a transistor, a metal oxide semiconductor field effect transistor (MOSFET), a diode, an amplifier, a filter, and a memory. Semiconductor element 49 is electrically insulated from semiconductor chip 1 by a separated pattern 29, and therefore may be a semiconductor chip with low insulation resistance. It should be noted that the semiconductor chip with low insulation resistance is lower in cost than a semiconductor chip with high insulation resistance. Therefore, when semiconductor element 49 is a semiconductor chip with low insulation resistance, the production cost of semiconductor module 100 can be reduced.

Semiconductor elements 49 are desirably combined to achieve high thermal conductivity. When the area of semiconductor element 49 is larger, thermal conductivity of semiconductor element 49 is larger.

Hereinbelow, the function and effect of the present embodiment will be described.

In semiconductor module 100 according to the present embodiment, as shown in FIG. 19, heat-dissipating component 4 is constituted from semiconductor element 49 having a structure that is the same as or different from that of semiconductor chip 1. Therefore, heat-dissipating component 4 (semiconductor element 49) can be implemented by the same implementation method as used for implementation of semiconductor chip 1. Further, heat-dissipating component 4 (semiconductor element 49) can be implemented at the same time with implementation of semiconductor chip 1. Further, a solder material for semiconductor chip 1 can be used also as a joining material for semiconductor element 49. Thus, it is possible to simplify the assembling process of semiconductor module 100. This makes it possible to reduce the production cost of semiconductor module 100.

Embodiment 7

The present embodiment is directed to a power converter to which the semiconductor module according to any of Embodiments 1 to 6 described above is applied. The present disclosure is not limited to a specific power converter, but Embodiment 7 will be described below with reference to a case where the present disclosure is applied to a three-phase inverter.

Figure 20:
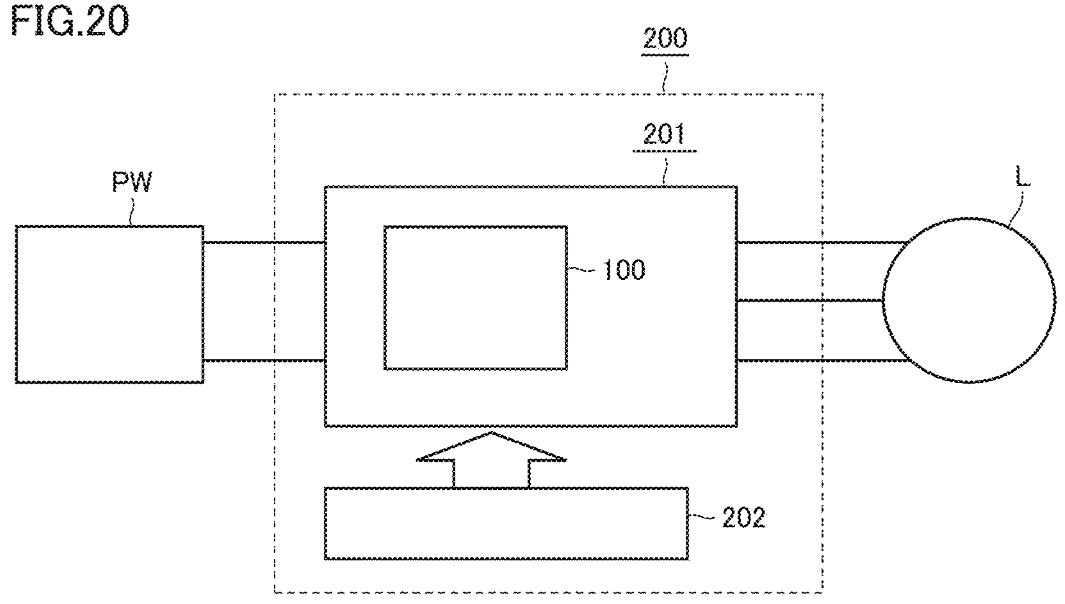
FIG. 20 is a block diagram schematically showing the configuration of a power converter according to Embodiment 7.

FIG. 20 is a block diagram showing the configuration of a power converting system to which the power converter according to the present embodiment is applied.

The power converting system shown in FIG. 20 is constituted from a power source PW, a power converter 200, and a load L. Power source PW is a direct-current power source, and supplies direct-current power to power converter 200. Power source PW can be constituted from any of various components such as a direct-current system, a solar cell, and a secondary battery. Alternatively, power source PW may be constituted from a rectifier circuit or an AC/DC converter connected to an alternating-current system. Alternatively, power source PW may be constituted from a DC/DC converter to convert direct-current power that is output from a direct-current system into predetermined power.

Power converter 200 is a three-phase inverter connected between power source PW and load L, and converts direct-current power supplied from power source PW into alternating-current power to supply alternating-current power to load L. As shown in FIG. 20, power converter 200 includes a main converter circuit 201 to convert direct-current power into alternating-current power and output the alternating-current power and a control circuit 202 to output a control signal for controlling main converter circuit 201 to main converter circuit 201.

Load L is a three-phase electric motor driven by alternating-current power supplied from power converter 200. It should be noted that load L is not limited to one for specific use, and is an electric motor installed in any of various electric machines such as hybrid automobiles, electric cars, railway vehicles, elevators, and air conditioners.

Hereinbelow, the details of power converter 200 will be described. Main converter circuit 201 includes a switching element and a free-wheeling diode (not shown), and therefore direct-current power supplied from power source PW is converted into alternating-current power by switching of the switching element, and the alternating-current power is supplied to load L. A specific circuit configuration of main converter circuit 201 may be any of various circuit configurations, but main converter circuit 201 according to the present embodiment is a two-level three-phase full-bridge circuit that can be constituted from six switching elements and six free-wheeling diodes respectively connected in inverse parallel to the switching elements. At least any of the switching elements and the free-wheeling diodes of main converter circuit 201 is a switching element or a free-wheeling diode that semiconductor module 100 corresponding to the semiconductor module according to any one of Embodiments 1 to 6 described above has. The six switching elements are connected two by two in series to constitute upper and lower arms, and the sets of the upper and lower arms respectively constitute the phases (U phase, V phase, W phase) of the full-bride circuit. The output terminals of the sets of the upper and lower arms, that is, three output terminals of main converter circuit 201 are connected to load L.

Main converter circuit 201 includes a driving circuit (not shown) to drive the switching elements. The driving circuit may be included in semiconductor module 100 or may be provided separately from semiconductor module 100. The driving circuit generates driving signals for driving the switching elements of main converter circuit 201 and supplies the driving signals to the control electrodes of the switching elements of main converter circuit 201. Specifically, the driving circuit outputs a driving signal for turning on the switching element and a driving signal for turning off the switching element to the control electrodes of the switching elements according to a control signal from control circuit 202 that will be described later. When the switching element is maintained turned-on, the driving signal is a voltage signal (ON signal) greater than or equal to the threshold voltage of the switching element, and when the switching element is maintained turned-off, the driving signal is a voltage signal (OFF signal) less than or equal to the threshold voltage of the switching element.

Control circuit 202 controls the switching elements of main converter circuit 201 so that desired electric power is supplied to load L. Specifically, the time (ON time) when each of the switching elements of main converter circuit 201 should be turned on is calculated on the basis of electric power that should be supplied to load L. For example, main converter circuit 201 can be controlled by PWM control such that the ON times of the switching elements are modulated according to a voltage that should be output. Then, control circuit 202 outputs a control command (control signal) to the driving circuit included in main converter circuit 201 so that an ON signal and an OFF signal are respectively output to the switching element that should be turned on and the switching element that should be turned off at each time point. The driving circuit outputs, as a driving signal, an ON signal or an OFF signal to the control electrode of each of the switching elements according to this control signal.

The power converter according to the present embodiment uses as semiconductor module 100 constituting main converter circuit 201, the semiconductor module according to any of Embodiments 1 to 6, which makes it possible to achieve a power converter capable of reducing restrictions on layout design.

The present embodiment has been described with reference to a case where the present disclosure is applied to a two-level three-phase inverter, but the present disclosure can be applied not only to that but also to various power converters. The power converter according to the present embodiment is a two-level power converter, but the present disclosure may be applied to a three-level or multi-level power converter. When electric power is supplied to a single-phase load, the present disclosure may be applied to a single-phase inverter. Further, when electric power is supplied to a direct-current load or the like, the present disclosure can be applied also to a DC/DC converter or an AC/DC converter.

The power converter to which the present disclosure is applied is not limited to one used when the load is an electric motor, and can be used also as, for example, a power source device of an electric discharge machine, a laser beam machine, an induction heating-type cooking apparatus, or a wireless charging system, and further can be used also as a power conditioner for a solar power generation system, a power storage system, or the like.

The embodiments disclosed herein are illustrative in all aspects and should not be construed as restrictive. The scope of the present invention is defined by claims rather than the above description, and is intended to include all modifications within the spirit and scope equivalent to the claims.

REFERENCE SIGNS LIST

1: semiconductor chip, 2: insulating substrate, 3: relay board, 4: heat-dissipating component, **4*a*: first member, 4*b*: second member, 5: electrode terminal, 21: main circuit pattern, 22: insulating layer, 23: base plate, 29: separated pattern, 41: first surface, 42: second surface, 49: semiconductor element, 100: semiconductor module, 200: power converter, 201: main converter circuit, 202**: control circuit, L: load, PW: power source

The invention claimed is:

1. A semiconductor module comprising:

a semiconductor chip;

an insulating substrate including a main circuit pattern electrically connected to the semiconductor chip and an insulating layer sandwiching the main circuit pattern together with the semiconductor chip;

a relay board to sandwich the semiconductor chip together with the main circuit pattern in a sandwiching direction in which the insulating layer and the semiconductor chip sandwich the main circuit pattern, the relay board being electrically connected to the main circuit pattern through the semiconductor chip;

a heat-dissipating component sandwiched between the insulating substrate and the relay board in the sandwiching direction; and a conductive post sandwiched between the main circuit pattern and the relay board in the sandwiching direction, the conductive post being electrically connected to the main circuit pattern and the relay board, wherein the heat-dissipating component is electrically insulated from the main circuit pattern, and the main circuit pattern at least partially surrounds the heat-dissipating component on the insulating layer.

2. The semiconductor module according to claim 1, wherein the insulating substrate includes a separated pattern that is disposed on a same side as the main circuit pattern with respect to the insulating layer and that is electrically insulated from the main circuit pattern, and the heat-dissipating component is sandwiched between the separated pattern and the relay board.

3. The semiconductor module according to claim 2, wherein the separated pattern is at least partially surrounded by the main circuit pattern on the insulating layer.

4. The semiconductor module according to claim 1, further comprising an electrode terminal, wherein the electrode terminal is connected to the relay board and protrudes from the relay board in a direction opposite to the insulating substrate.

5. The semiconductor module according to claim 4, wherein the electrode terminal and the heat-dissipating component sandwich the relay board.

6. The semiconductor module according to claim 1, wherein the heat-dissipating component includes a first member and a second member, the first member and the second member are spaced from each other, and the relay board is connected to the insulating substrate through the first member and the second member.

7. The semiconductor module according to claim 6, wherein the first member and the second member are spaced from each other by a distance greater than a dimension of each of the first member and the second member.

8. The semiconductor module according to claim 6, wherein each of the first member and the second member includes a plurality of heat-dissipating parts spaced from each other.

9. The semiconductor module according to claim 8, wherein the plurality of heat-dissipating parts are spaced from each other by a distance greater than a dimension of each of the plurality of heat-dissipating parts.

10. The semiconductor module according to claim 1, wherein the heat-dissipating component includes a first surface joined to the insulating substrate and a second surface joined to the relay board, and the second surface has a larger area than the first surface.

11. The semiconductor module according to claim 1, wherein the insulating substrate includes a base plate disposed on an opposite side of the main circuit pattern from the semiconductor chip, and the heat-dissipating component is directly connected to the base plate.

12. The semiconductor module according to claim 1, wherein the heat-dissipating component is a metallic column.

13. The semiconductor module according to claim 1, wherein the heat-dissipating component is constituted from a semiconductor element having a structure that is the same as or different from that of the semiconductor chip.

14. A power converter, comprising:

a main converter circuit including the semiconductor module according to claim 1, to convert input electric power and output the converted input electric power; and a control circuit to output a control signal for controlling the main converter circuit to the main converter circuit.

15. The semiconductor module according to claim 1, wherein the relay board is provided with a first conductive wiring layer and a second conductive wiring layer in that order from a semiconductor chip side, a conductive post passes through the first conductive wiring layer and is electrically connected to the second conductive wiring layer, and the heat-dissipating component transfers heat to the insulating substrate via the first conductive wiring layer.

16. The semiconductor module according to claim 1, wherein a gap between the heat-dissipating component and the main circuit pattern is greater than or equal to an insulation distance between the heat-dissipating component and the main circuit pattern.

17. The semiconductor module according to claim 1, further comprising a conductive post that electrically connects the main circuit pattern and the relay board.

18. The semiconductor module according to claim 1, wherein the semiconductor chip includes a first chip and a second chip electrically connected in parallel to each other.

19. The semiconductor module according to claim 18, wherein each of the first chip and the second chip includes a plurality of chips electrically connected in parallel to each other.

20. The semiconductor module according to claim 1, further comprising a joining member including a first joining member and a second joining member, wherein the semiconductor chip is fixed to the main circuit pattern with the first joining member and is fixed to the relay board with the second joining member.

* * * * *